United States Patent [19]

Asano et al.

[11] 4,385,337

[45] May 24, 1983

[54] CIRCUIT INCLUDING AN MOS TRANSISTOR WHOSE GATE IS PROTECTED FROM OXIDE RUPTURE

[75] Inventors: Masamichi Asano, Musashino; Hiroshi Iwahashi; Ichiro Kobayashi, both of Yokohama, all of Japan

[73] Assignee: Tokyo Shibaura Denki Kabushiki Kaisha, Kanagawa, Japan

[21] Appl. No.: 273,183

[22] Filed: Jun. 12, 1981

[30] Foreign Application Priority Data

Jun. 18, 1980 [JP] Japan ................................. 55-82420

[51] Int. Cl.³ ............................................. H02H 3/20
[52] U.S. Cl. ................................ 361/91; 307/200 B; 361/56
[58] Field of Search ..................... 361/91, 86, 56, 100; 307/200 B, 304, 279

[56] References Cited

U.S. PATENT DOCUMENTS

| | | | |
|---|---|---|---|
| Re. 27,972 | 4/1974 | Borror et al. | 361/91 |
| 3,636,385 | 1/1972 | Koepp | 307/304 |
| 3,746,946 | 7/1973 | Clark | 361/56 X |
| 3,819,952 | 6/1974 | Enomoto et al. | 361/56 |
| 3,909,674 | 9/1975 | Spence et al. | 307/200 B X |

FOREIGN PATENT DOCUMENTS 43-455 1/1968 Japan .

OTHER PUBLICATIONS

MOS/LSI Design & Application, pp. 96–101, William et al., McGraw-Hill Book Company, 1972.

Primary Examiner—Reinhard J. Eisenzopf
Attorney, Agent, or Firm—Cushman, Darby & Cushman

[57] ABSTRACT

A protected MOS transistor circuit includes an input MOS transistor and a depletion mode MOS transistor having a drain-source current path connected between ground and the gate of the input MOS transistor of obviating rupture of the gate oxide of the input MOS transistor when power is off. The depletion mode MOS transistor's gate receives a control signal only when power is on which renders the depletion mode MOS transistor nonconductive when power is on. The depletion mode MOS transistor is conductive when power is off.

14 Claims, 8 Drawing Figures

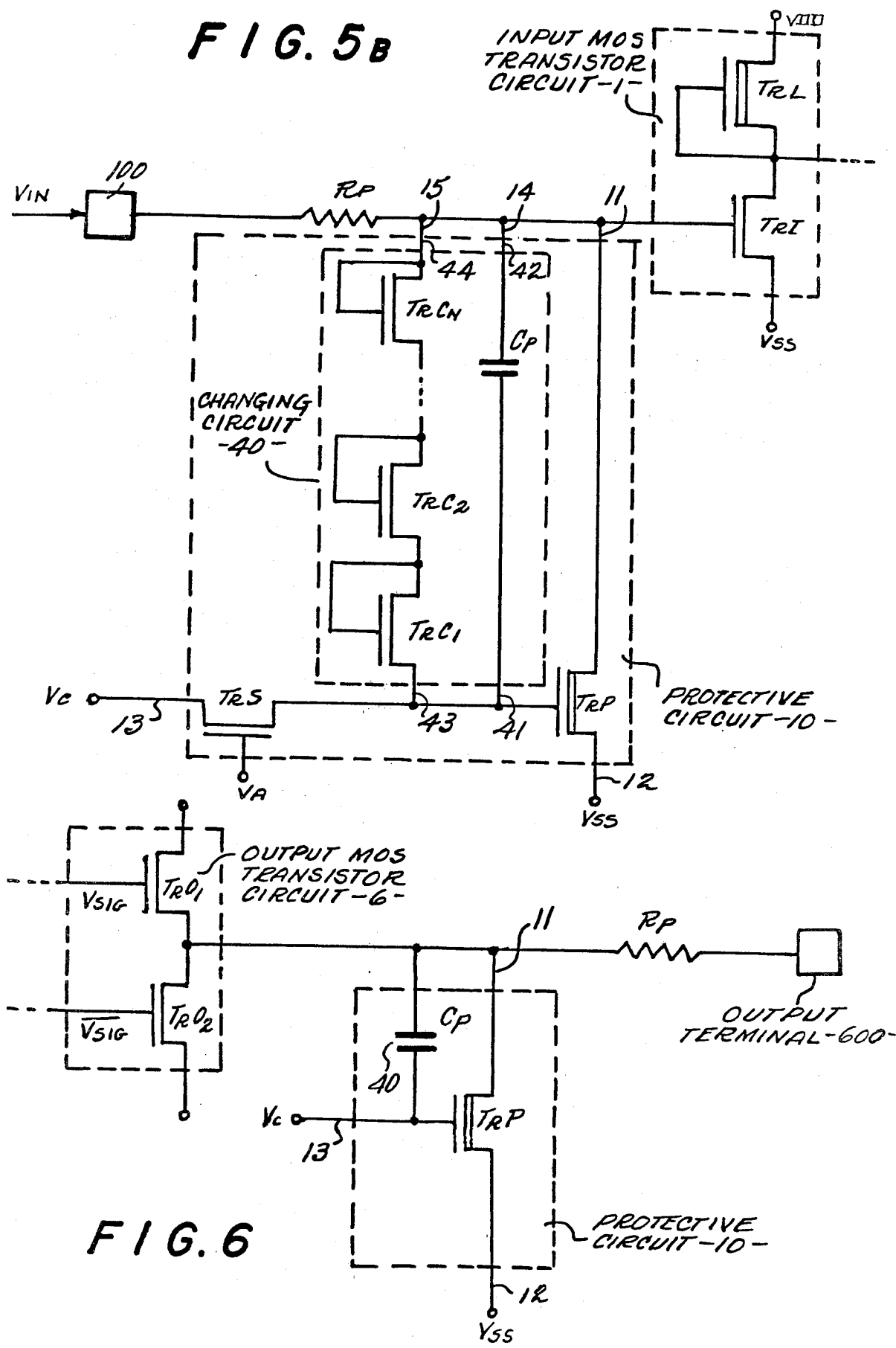

CIRCUIT INCLUDING AN MOS TRANSISTOR WHOSE GATE IS PROTECTED FROM OXIDE RUPTURE

BACKGROUND OF THE INVENTION (1) Field of the Invention

This invention relates to a protected MOS transistor circuit, and more particularly to a MOS transistor integrated circuit which includes a circuit for obviating rupture of the gate oxide of an MOS transistor when power is off.

(2) Description of the Prior Art

It has been known that a relatively high potential applied to the gate of a MOS transistor causes the rupture of the gate oxide. This rupture results in a permanent electrical short between the gate and the substrate on which the MOS transistor is formed, thereby destroying the MOS transistor.

The gate oxide ruptures when the dielectric strength of the gate oxide, made of, for example, silicon dioxide, is more than approximately $10^7$ V/cm. Thus, for example, if 80–100 V is applied across a 800–1000 Angstrom thick gate oxide, rupture occurs. (Hereinafter, the voltage at which rupture occurs is referred to as the dielectric breakdown voltage.)

Therefore a protective input circuit, which provides a voltage-limiting function, is usually placed at each of the signal input terminals of a MOS transistor integrated circuit chip (MOS IC chip) connected to a MOS transistor gate.

Various kinds of protective input circuits have been used as shown, for example, at pp. 96–101 in *MOS/LSI Design and Application* (Dr. William N. Carr and Dr. Jack P. Mize; Edited by Robert E. Sawyer and John R. Miller; McGraw-Hill Book Company), and in U.S. Pat. No. Re. 27,972 to Daniel R. Borror, et al.

These protective input circuits utilize either the breakdown voltage of a zener diode or the high threshold voltage of a thick-oxide MOS transistor to provide protection. The protective voltage (i.e. the breakdown voltage of the zener diode or the high threshold voltage of the thick-oxide MOS transistor) is set to be lower than the dielectric breakdown voltage at which the gate oxide ruptures.

Despite these protective input circuits, ruptures occur during handling (shipping, testing, circuit board assembly, etc.), especially in large scale integrated (LSI) circuits, due to current surges.

This problem has become more significant due to the fact that gate oxide layers have become thinner (e.g., 300–500 Angstrom) as the density of elements in integrated circuits has increased.

That is, the dielectric breakdown voltage has become lower as the gate oxide has become thinner; and as a result, the dielectric breakdown voltage has become approximately equal to or occasionally lower than the protective voltage.

Further, even if the dielectric breakdown voltage is higher than the protective voltage, rupture of the gate oxide often occurs, because the protective zener diode or thick-oxide MOS transistor does not respond promptly when excessive current surges occur at the signal input terminals. Therefore rupture of the gate oxide takes place before the protective zener diode or thick-oxide MOS transistor becomes conductive. The slow response of the protective zener diode or thick-oxide MOS transistor occasionally results in rupture of the zener diode or the thick-oxide MOS transistor itself.

The rupture problem occurs not only with input MOS transistors but also with output MOS transistors. Furthermore, the rupture problem occurs in handling much more when power is off than when power is on. In fact, the rupture problem seldom occurs when power is on. Therefore, a need exists for a protective circuit for an MOS transistor circuit which can protect an MOS transistor from rupture caused by excessive current surges, especially during handling when power is off.

SUMMARY OF THE INVENTION

Accordingly, one object of this invention is to provide an improved MOS transistor protective circuit.

Another object of this invention is to provide an improved protected MOS transistor circuit suitable for integration.

A further object of this invention is to provide an improved protected MOS transistor circuit which protects the gate-oxide of an input MOS transistor from rupture caused by excessive current surges when power is off.

Yet another object of this invention is to provide an improved protected MOS transistor circuit which protects an output MOS transistor from rupture by excessive current surges when power is off.

To achieve these objects, the MOS transistor and protective circuit according to this invention includes an input MOS transistor having a gate which receives an input signal when power is on, and a protective circuit for shorting the input MOS transistor gate to ground only when power is off, thereby obviating rupture of the gate oxide of the input MOS transistor. The protective circuit may also be employed with an MOS transistor output circuit.

BRIEF DESCRIPTION OF THE DRAWINGS

These and other objects and advantages of the present invention will become apparent and more readily appreciated from the following detailed description of the presently preferred exemplary embodiments of the present invention taken in conjunction with the accompanying drawings of which:

FIG. 5B is a circuit similar to that of FIG. 5A with a plurality of serially connected transistors replacing a single transistor; and FIG. 6 illustrates the protective circuit of FIG. 3 connected to an output MOS transistor circuit.

DESCRIPTION OF THE PREFERRED EMBODIMENTS

Figure 1:
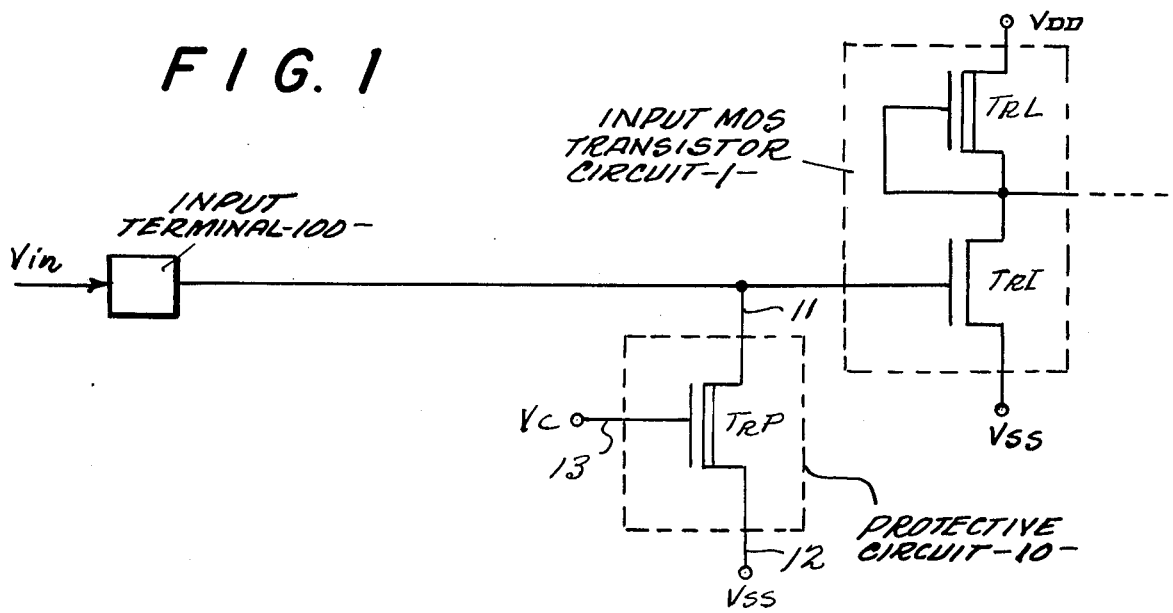
FIG. 1 is a circuit diagram of an MOS transistor input circuit with a protective circuit according to the present invention consisting of a depletion type MOS transistor.

FIG. 1 illustrates an MOS transistor and protective circuit according to a typical embodiment of this invention, which is formed as an MOS transistor IC chip. The MOS transistor and protective circuit includes an input MOS transistor circuit 1 and a protective means such as circuit 10.

Input MOS transistor circuit 1 may be, for example, an inverter circuit which includes an N channel type depletion mode MOS transistor TrL as a load and an N channel type enhancement mode MOS transistor TrI as a driver. MOS transistor TrL has a drain connected to one positive voltage level $V_{DD}$ (e.g. 5 V), a source and a gate connected to the source. The threshold voltage of MOS transistor TrL is, for example, $-2$ V. MOS transistor TrI is an input MOS transistor, having a drain connected to the source of transistor TrL, a source connected to one reference voltage level $V_{ss}$ (e.g. ground), and a gate connected to signal input terminal 100 and to one reference voltage level $V_{ss}$ (e.g., ground) through protective circuit 10. The threshold voltage of MOS transistor TrI is 0.8 V. An input signal $V_{in}$ is applied to the gate of input transistor TrI, and a signal related to $V_{in}$ is outputted from the drain of the input MOS transistor TrI to another MOS transistor (not shown).

Protective circuit 10 includes an N channel type, depletion mode MOS transistor TrP. Transistor TrP has a drain connected at a first terminal 11 to the gate of input MOS transistor TrI, a source connected at a second terminal 12 to the reference voltage level $V_{ss}$, and a gate connected at a third terminal 13 to receive the control voltage level $V_c$. The threshold voltage $V_{thp}$ of transistor TrP is, for example, $-2$ V.

When power is off (i.e., when no power is supplied to the integrated circuit in which the MOS transistor circuit is formed), for example, in shipping, control signal $V_c$ is not supplied to the gate of MOS transistor TrP. Therefore, the voltage on the gate of transistor TrP is maintained at substantially zero. Accordingly, transistor TrP is conductive when power is off, because transistor TrP is of the depletion mode. As a result, excessive current surges occurring at signal input terminal 100, when power is off, are quickly discharged through transistor TrP, and the gate oxide of input MOS transistor TrI is protected from rupture.

When power is on (i.e., when power is supplied to the integrated circuit in which the MOS transistor circuit is formed), the circuit is in ordinary operation and control signal $V_c$ is supplied to the gate of protective MOS transistor TrP.

The value of control signal $V_c$ is selected to render transistor TrP nonconductive. In this embodiment, $V_c$ is, for example, $-3$ V and has the following relation (for nonconduction): $V_c - V_{ss} < V_{thp}$. Since $V_{thp}$ is $-2$ V, depletion mode MOS transistor TrP is kept nonconductive when power is on, and accordingly does not affect input MOS transistor TrI.

It should be noted that excessive current surges which may cause rupture of the gate oxide of input MOS transistor TrI generally occur when power is off and seldom, if ever occur when power is on. Accordingly, rupture of the gate oxide of input MOS transistor TrP can be substantially avoided when the gate oxide is sufficiently protected when power is off. In the embodiment of FIG. 1, the gate oxide of input MOS transistor TrI is sufficiently protected when power is off because protective circuit 10 connects the gate of MOS transistor TrI to one reference voltage level $V_{ss}$ (e.g. ground or 5 V).

Further, a p-n junction (i.e. a zener diode) is naturally formed between the drain of protective MOS transistor TrP and the substrate on which the MOS transistor circuit is formed. Therefore rupture due to current surges is also protected by breakdown of this p-n junction.

Thus, as is apparent to those skilled in the art, transistor TrP is employed to absorb energy. The capacitance of its substrate is large, and in fact much larger than the capacitance of the source of the surge, typically a human body (most likely, the surge is caused by someone touching the input terminal). Therefore, the voltage that develops at the gate of transistor TrI is relatively small, when transistor TrP conducts. When transistor TrP does not conduct, the capacitance of a substrate is relatively small and thus transistor TrP does not absorb substantial energy, and thus does not affect the circuit.

A conventional protective input circuit as shown, for example, on pp. 96-101 of *MOS/LSI Design and Application* (Dr. William N. Carr and Dr. Jack P. Mize; Edited by Robert E. Sawyer and John R. Miller; McGraw-Hill Book Company) may be used in combination with protective circuit 10 of our invention.

Control signal $V_c$ may be supplied as an external voltage from outside of the MOS transistor integrated circuit chip on which input MOS transistor circuit 1 and protective circuit 10 are formed. However, $V_c$ may also be generated inside the chip. A substrate voltage level (i.e. substrate bias voltage) can be utilized as $V_c$ if a substrate voltage generating circuit is contained in the chip. The substrate voltage generating circuit itself is well known and an example is disclosed in U.S. Pat. No. 3,806,741 to Frederic J. Smith.

Figure 2:
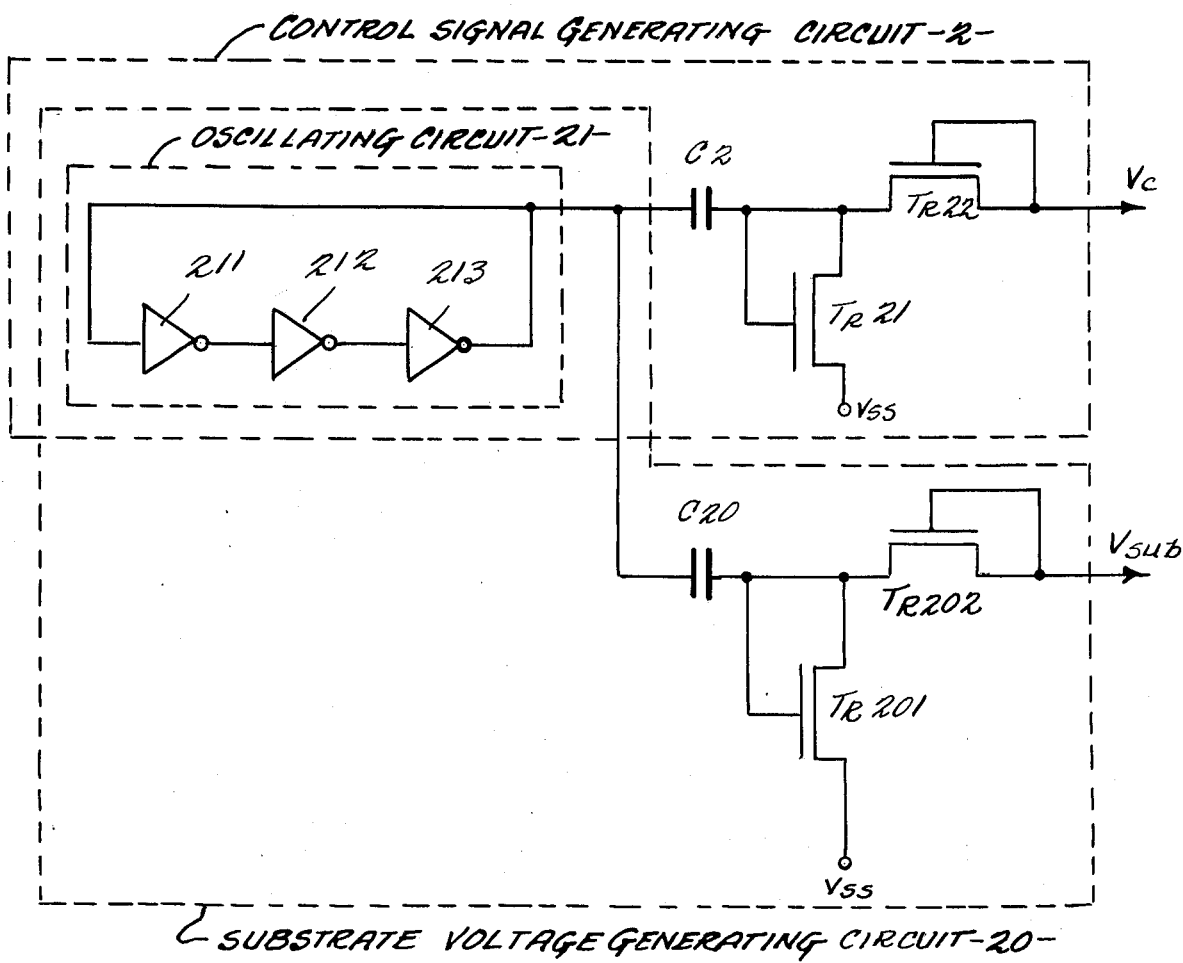
FIG. 2 is a circut diagram of a control voltage level generating circuit which generates a control voltage level used in the circuitry illustrated in FIG. 1.

FIG. 2 shows one example of a control signal generating circuit suitable for generating $V_c$.

The control signal generating circuit 2 has fundamentally the same structure as the known substrate voltage generating circuit which is also shown by numeral 20 in FIG. 2.

That is, the control signal generating circuit 2 comprises an oscillation circuit 21, a capacitor $C_2$, an N channel type enhancement mode MOS transistor Tr21 employed as a rectification circuit, and another N channel type enhancement mode MOS transistor Tr22 employed as a rectification circuit. The oscillation circuit 21 comprises, for example, three inverters 211, 212 and 213 connected in series with the output terminal of inverter 213 connected to the input terminal of inverter 211.

The output terminal of inverter 213 is also connected to one terminal of capacitor $C_2$. The other terminal of capacitor $C_2$ is connected to the drain and gate of transistor Tr21, the source of which is connected to one reference voltage level $V_{ss}$ (e.g. ground). The drain of transistor Tr21 is connected to one current conducting terminal (i.e. the source or the drain) of transistor Tr22. The gate of transistor Tr22 is connected to the other current conducting terminal (i.e. the drain or the source) of transistor Tr22. An output signal (i.e. an output constant voltage level) is outputted from the other terminal of transistor Tr22, and is used as the control signal $V_c$ which is, for example, $-3$ V when power is on, and substantially 0 V when power is off.

The substrate voltage generating circuit 20 comprises the oscillation circuit 21 shared with the control signal generating circuit 2 in this embodiment, a capacitor $C_{20}$, an N channel type enhancement mode MOS transistor Tr201 employed as a rectification circuit, and another N channel type enhancement mode MOS transistor Tr202 employed as a rectification circuit.

The output terminal of oscillation circuit 21 is connected to one terminal of the capacitor $C_{20}$. The other terminal of capacitor $C_{20}$ is connected to the drain and gate of transistor Tr201, the source of which is connected to one reference voltage level $V_{ss}$ (e.g. ground). The drain of transistor Tr201 is connected to current conducting terminal (i.e. the source or the drain) of transistor Tr202. The gate of transistor Tr202 is connected to the other current carrying terminal (i.e. the drain or the source) of transistor Tr202. An output signal (i.e. an output constant voltage level) is outputted from the other terminal of transistor Tr202, and is used as a substrate bias voltage $V_{sub}$ which is, for example, $-3$ V when power is on.

As is apparent from the above description, the substrate bias voltage $V_{sub}$ may be used directly as control signal $V_c$, especially when a small number of transistors are required in a MOS transistor integrated circuit. However, it is better to use a control signal $V_c$ which is generated independently of a substrate bias voltage $V_{sub}$ as shown in FIG. 2 if a MOS transistor circuit is required to operate quickly in a stable condition as soon as electric power (a battery) is supplied to the circuit. This is because when power is applied, the substrate bias voltage $V_{sub}$ does not reach a desired voltage level (e.g. $-3$ V), rendering protective MOS transistor TrP nonconductive, quickly due to a parasitic substrate capacitance which is comparatively large. That is, protective MOS transistor TrP, which should turn off when power is applied, may remain conductive and leakage currents may flow through transistor TrP for a while after electric power is supplied. If control signal $V_c$ is generated independently of the substrate bias voltage $V_{sub}$, $V_c$ quickly reaches a desired voltage level (e.g. $-3$ V), because the control signal $V_c$ is not influenced by the large capacitance of a substrate.

In MOS transistors the threshold voltage, $V_{th}$, is dependent on the substrate voltage. Specifically, $V_{th}$ increases when the substrate becomes more negative. In many instances the substrate voltage is zero, and in this application typical values of $V_{th}$ are given for the substrate voltage being zero. Typically, for depletion mode MOS transistors, $V_{th}$ is negative for all values of substrate voltage. However for certain depletion mode transistors, $V_{th}$ changes from a negative value to a positive value as the substrate voltage becomes more negative.

Figure 2A:
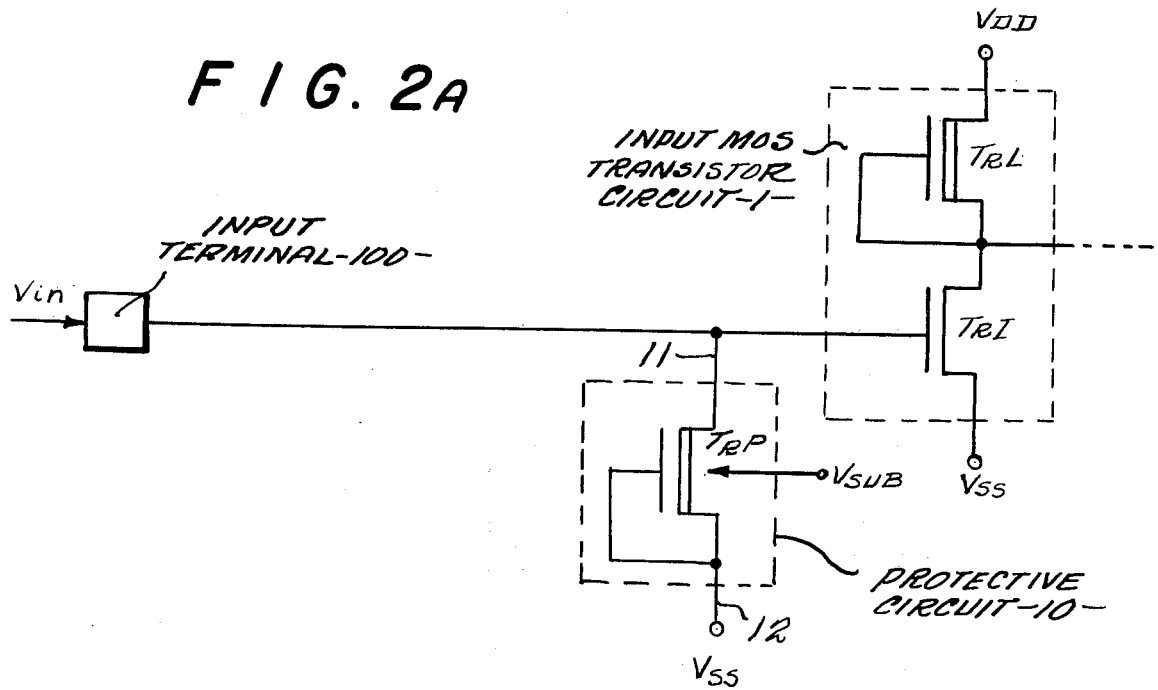
FIG. 2A illustrates an input MOS transistor circuit with a protective circuit according to the present invention including a depletion type MOS transistor connected in an alternate manner.

This suggests a manner of employing the present invention which eliminates control signal generating circuit 2 as long as substrate biasing circuit 20 is employed, and this embodiment is illustrated in FIG. 2A. In this embodiment the gate and source of transistor TrP are connected together. Transistor TrP must be the type of depletion mode transistor as described above whose threshold voltage $V_{th}$ becomes positive when the substrate voltage is sufficiently negative.

When power is off, the substrate voltage is 0, so $V_{thp}$ is negative. Since $V_c = V_{ss} = 0$, the condition for nonconductance, $V_c - V_{ss} < V_{thp}$, is not met so transistor TrP conducts. When power is on, the substrate voltage is decreased to cause $V_{th}$ to become positive. Since $V_c = V_{ss} = 0$, the condition for nonconductance is met, so protective circuit 10 operates as described above with respect to the previous embodiment.

Figure 3:
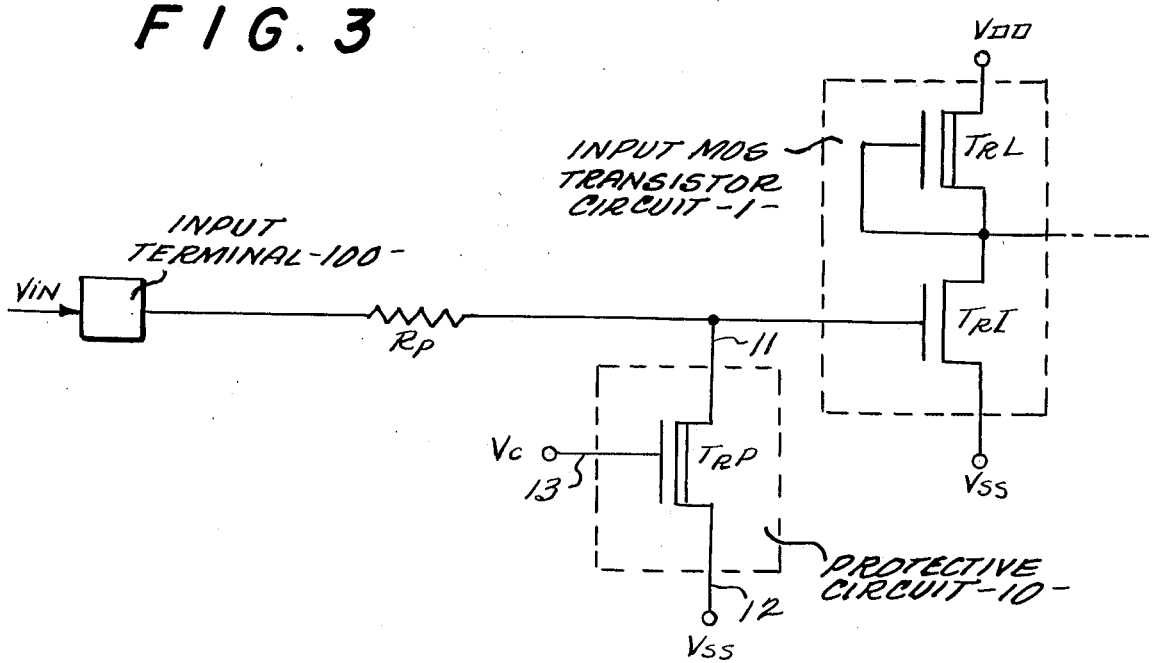
FIG. 3 is a circuit diagram similar to that illustrated in FIG. 1 with the inclusion of a protective resistor.

The embodiment illustrated in FIG. 3 is different from the preceding embodiment because of the addition of a protective resistor $R_p$ between input terminal 100 and both the gate of transistor TrI and the drain of transistor TrP. Due to the similarity, the same reference numerals are applied to corresponding elements in FIGS. 1 and 3, and description thereof is omitted. Resistor $R_p$ may be, for example, a diffused resistor which makes a p-n junction with the substrate. Resistor $R_p$ is preferably 1kΩ–2kΩ, and functions to depress excessive current surges which occur at input terminal 100. That is, the voltage level at terminal 11 is lower than the voltage at input terminal 100, because the current flowing through resistor $R_p$ and transistor TrP causes a voltage drop across resistor $R_p$. Therefore the gate oxide of input transistor TrI is highly protected, and protective circuit 10 itself is also protected from rupture due to the surges.

Figure 4:
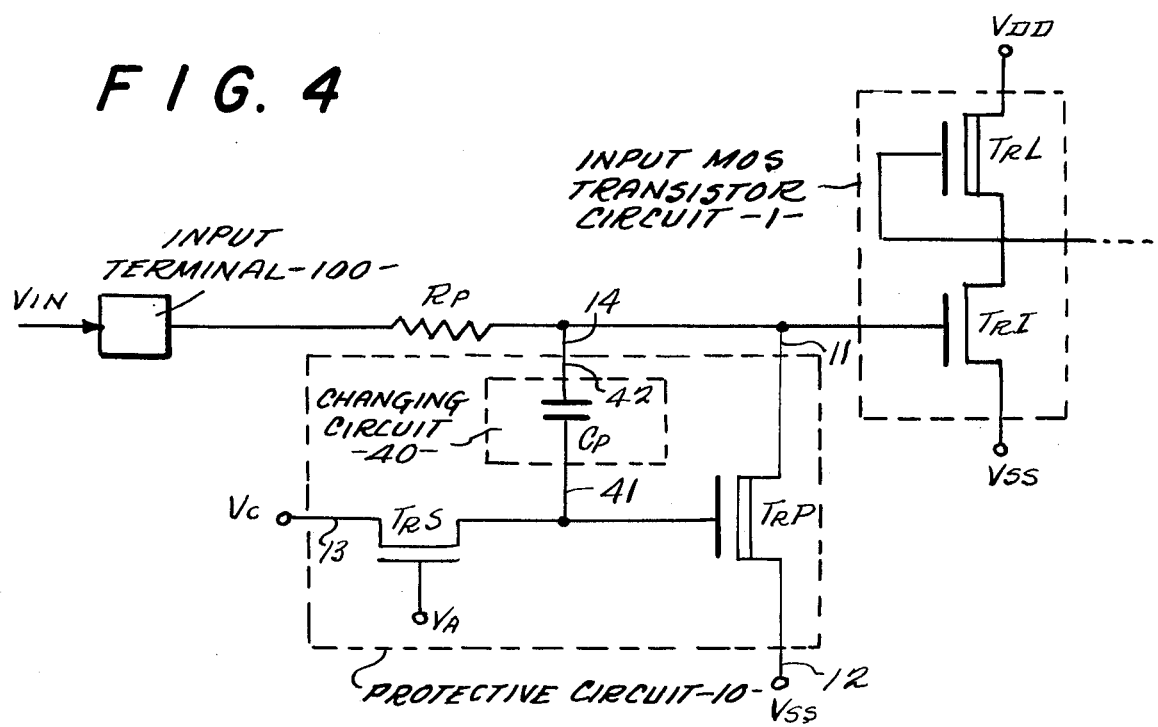
FIG. 4 is a circuit diagram of a circuit similar to FIG. 3 with the inclusion of a capacitor.

The difference between the embodiment of FIG. 3 and the embodiment of FIG. 4 is that protective circuit 10 in FIG. 4 includes a changing circuit 40, and a switching MOS transistor TrS. The embodiment of FIG. 4 has substantially the same arrangement and operation as that of FIG. 3 in other respects. The same parts of the embodiment of FIG. 4 as those of the embodiment of FIG. 3 are denoted by the same numerals.

Protective circuit 10 in this embodiment has a first terminal 11 connected to input terminal 100 through protective resistor $R_p$, a second terminal 12 connected to one reference voltage level (e.g. ground), a third terminal 13, to receive control signal $V_c$, and a fourth terminal 14 connected to input terminal 100 through protective resistor $R_p$.

The gate of protective MOS transistor TrP is connected to a first terminal 41 of changing circuit 40. Changing circuit 40 has also a second terminal 42 which is connected to terminal 14 of protective circuit 10. Changing circuit 40 aids in changing the conductivity of protective MOS transistor TrP in accordance with the magnitude of the excessive current surges which occur at input terminal 100. Changing circuit 40 includes a capacitor $C_p$, which has one terminal connected to terminal 41 of changing circuit 40, and another terminal connected to terminal 42 of changing circuit 40.

When excessive current surges occur at input terminal 100 when power is off, the voltage potential at terminal 14 of changing circuit 40 changes in response thereto. Then the voltage potential on the gate of protective MOS transistor TrP also changes because of capacitor $C_p$. In other words, the voltage on the gate of protective MOS transistor TrP becomes large when the voltage caused by the surges is large, and the voltage on the gate becomes small when that caused by the surges is small. This means that the conductivity of the source-drain current path of protective MOS transistor TrP increases as the surge voltage increases the channel of transistor TrP. Therefore even if larger surges occur when power is off, the surges are discharged more quickly and more easily through the source-drain current path having increased conductivity. That is, the gate of input MOS transistor TrI is much more efficiently protected from rupture. Further, the size of protective MOS transistor TrP can be made smaller because of the greater conductivity.

It is needless to say that the value of capacitor $C_p$, the gate oxide thickness and the threshold voltage $V_{thp}$ of transistor TrP, and the value of protective resistor $R_p$ of a diffused region are respectively determined by consideration that rupture of MOS transistor TrP should not occur.

Switching MOS transistor TrS is connected between the gate of protective MOS transistor TrP and terminal 13 of protective circuit 10 to ensure that changing circuit 40 works efficiently and so that the value of capacitor $C_p$ can be easily selected. Switching MOS transistor TrS is, for example, an N channel type enhancement mode transistor. The threshold voltage for transistor TrS is, for example, 0.8 V. When power is on, the gate of switching MOS transistor TrS receives a voltage level (a signal) $V_a$ which is, for example, the voltage level $V_{DD}$ (e.g. 5 V). This causes transistor TrS to be conductive when power is on and nonconductive when power is off. Therefore, the gate voltage level of protective MOS transistor TrP is not influenced when power is off by parasitic capacitance which exists, for example, in control signal generating circuit 2 as shown in FIG. 2; and the gate voltage level of transistor TrP is kept at $-3$ V $(=V_c)$ when power is on.

In the embodiment of FIG. 4, it is apparent from the above description that the gate oxide of input MOS transistor TrI is sufficiently protected when power is off because protective circuit 10 functions to connect the gate of the input MOS transistor TrI to one reference voltage level $V_{ss}$ (e.g. ground) when power is off. Further, in response to current surges, the conductivity of protective MOS transistor TrP becomes large and the gate of input MOS transistor TrI is efficiently protected from rupture, due to changing circuit 40. Also, the size of protective MOS transistor TrP can be made small because of the increased conductivity of protective MOS transistor TrP in response in current surges.

Figure 5A:
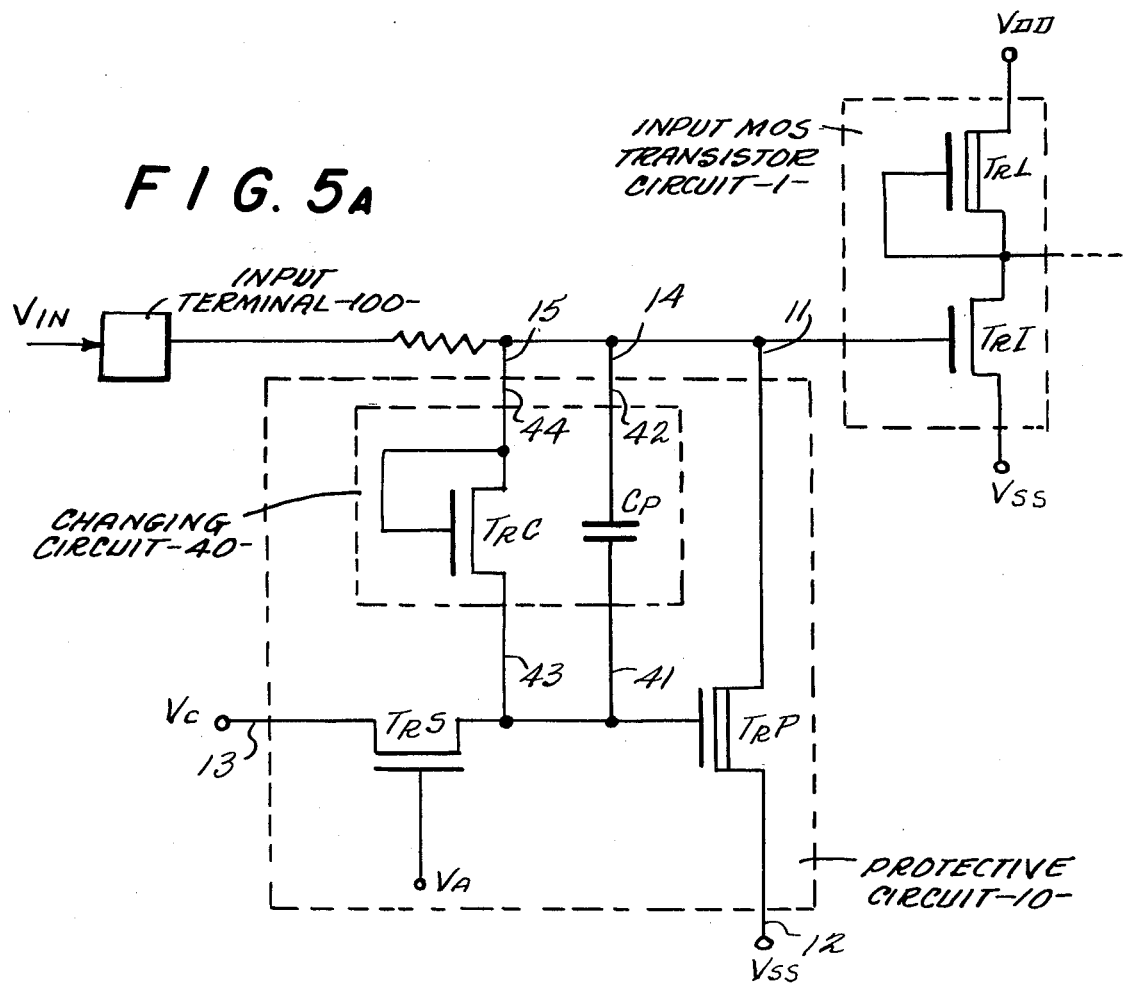
FIG. 5A is a circuit diagram similar to that of FIG. 4 with the addition of a transistor in parallel with the capacitor.

As is readily apparent from the Figures, the difference between the embodiment of FIG. 4 and the embodiment of FIG. 5A is the addition of MOS transistor TrC to changing circuit 40. Otherwise, the embodiment of FIG. 5A has substantially the same arrangement and operation as that of FIG. 4, and therefore the same parts of the embodiment of FIG. 5A as those of the embodiment of FIG. 4 are denoted by the same numerals, and description thereof is omitted.

MOS transistor TrC is connected in parallel with capacitor $C_p$, (i.e., MOS transistor TrC is also connected between the gate of protective MOS transistor TrP and protective resistor $R_p$.) MOS transistor TrC is, for example, an N channel type enhancement mode transistor. The source of transistor TrC is connected to a third terminal 43 of changing circuit 40, which is connected to the gate of protective MOS transistor TrP. The gate and the drain of the transistor TrC are connected together and to a fourth terminal 44 of changing circuit 40, which is connected to a fifth terminal 15 of protective circuit 10. Fifth terminal 15 is connected to input terminal 100 through protective resistor $R_p$.

When power is off, protective MOS transistor TrP is conductive because transistor TrP is of the depletion mode. If excessive current surges occur at input terminal 100 when power is off, the surges are discharged rapidly through the source-drain current path of protective MOS transistor TrP.

At this time, the conductivity of transistor TrP becomes large because current flowing through both capacitor $C_p$ and MOS transistor TrC increases the gate voltage level of transistor TrP, which increases the conductivity. If a current surge lasts for an extended period and changing circuit 40 consists only of capacitor $C_p$, the gate voltage level of protective MOS transistor TrP gradually decreases due to leakage current. However, the gate voltage of protective MOS transistor TrP as embodied in FIG. 5A is maintained at a voltage level not less than $(V_{15}-|V_{thc}|)$ when power is off in this embodiment because the MOS transistor TrC is used. [$V_{15}$ is a voltage level less than the surge level on fifth terminal 15 of protective circuit 10. $V_{thc}$ is the threshold voltage of MOS transistor TrC.]

Therefore, the conductivity of protective MOS transistor TrP is kept large when power is off, even though surges may continue for a long time. As a result, surges are discharged much more quickly and easily through the source-drain current path, the conductivity of which is kept large, even if the surges continue for a long time at powwer-off. Accordingly, the gate of input MOS transistor TrI is much more effectively protected from rupture.

When power is on, switching MOS transistor TrS is conductive and the control voltage $V_c$ $(=-3$ V) is supplied to the gate of the protective MOS transistor TrP. Therefore the protective MOS transistor TrP is kept nonconductive.

At this time, the MOS transistor TrC should not be conductive, either. Therefore threshold voltage $V_{thc}$ of transistor TrC is selected to have the following condition:

$$|V_{inh}-V_c|<|V_{thc}|.$$

[$V_{inh}$ is a high voltage signal of the input signal $V_{in}$ when power is on, and is generally $(V_{DD}+1V)$.]

When the threshold voltage $V_{thc}$ meets the above condition, MOS transistor TrC does not become conductive. Therefore neither transistor TrC nor transistor TrP affects the operation of input MOS transistor TrI when power is on.

In the embodiment of FIG. 5A, it is apparent from the above description that the gate oxide of input MOS transistor TrI is sufficiently protected when power is off because protective circuit 10 functions to connect the gate of input MOS transistor TrI to one reference voltage level $V_{ss}$ (e.g. ground) when power is off. Further, as a result of changing circuit 40, the conductivity of transistor TrP becomes large during surges to protect the gate of transistor TrI from rupture. Also, the conductivity of transistor TrP is kept large even if surges continue for a long time, because changing circuit 40 includes transistor TrC. In addition, the size of transistor TrP can be made small, because the conductivity of transistor TrP becomes large.

Although changing circuit 40 comprises both the capacitor $C_p$ and the transistor TrC in the embodiment of FIG. 5A, changing circuit 40 may comprise only transistor TrC, and when so embodied transistor TrC is able to effectively render the conductive transistor TrP large. However, changing circuit 40 comprising both capacitor $C_p$ and transistor TrC is preferable to changing circuit 40 comprising only capacitor $C_p$ or only transistor TrC.

In the embodiment of FIG. 5A, only one MOS transistor TrC is connected between terminal 43 and terminal 44 of changing circuit 40. This need not be the case. Instead, a plurality of MOS transistors may be used in place of the single MOS transistor. FIG. 5B shows a MOS transistor circuit with protective circuit 10 including a plurality of MOS transistors between terminal 43 and terminal 44 of changing circuit 40.

Thus single MOS transistor TrC, used in the FIG. 5A embodiment may be replaced by a plurality of MOS transistors $TrC_1$, $TrC_2$,—, $TrC_n$ as shown in FIG. 5B. Otherwise, the circuit in FIG. 5B is substantially the same in configuration and operation as that of FIG. 5A, so that the same parts of the circuits in FIG. 5B and FIG. 5A have the same reference and will not be described again.

Each of MOS transistors $TrC_1$, $TrC_2$,—, $TrC_n$ is, for example, an N channel type enhancement mode transistor having a source, a drain, and a gate. The gate and the drain of each of transistors $TrC_1$, $TrC_2$,—, $TrC_n$ are connected with each other.

The source-drain current paths of the MOS transistors $TrC_1$, $TrC_2$,—, $TrC_n$ are serially connected between terminal 43 and terminal 44 of changing circuit 40.

When excessive current surges continue for a long time when power is off, the gate voltage level of the protective MOS transistor TrP is kept at a voltage level not less than $$\left(V_{15} - \sum_{k=1}^{n} |V_{thck}|\right).$$

[$V_{15}$ is a voltage level greater than the surge level on terminal 15 of protective circuit 10. $V_{thck}$ (k=1,2,—, n) is the threshold voltage of transistor $TrC_k$ (k=1,2,—, n)]. Therefore the conductivity of MOS transistor TrP is kept large when power is off even if the surges continue for a long time.

Further, the gate voltage level of protective MOS transistor TrP is brought to a higher voltage level, which makes the conductivity of the protective MOS transistor TrP larger, without making the threshold voltage $V_{thck}$ (k=1,2,—, n) of the respective MOS transistors $TrC_1$, $TrC_2$,—, $TrC_n$ high, because a plurality of easily formable MOS transistors are used in changing circuit 40.

The respective threshold voltages $V_{thck}$ (k=1,2,—, n) must conform to the following condition:

$$|V_{inh} - V_c| < \sum_{k=1}^{n} |V_{thck}|$$

[$V_{inh}$ is a high voltage signal of the input signal $V_{in}$ when power is on, and is generally ($V_{DD}+1V$).] When the above condition is met, current does not flow from the signal input terminal 100 to a source (e.g. a control voltage level generating circuit) of the control voltage level $V_c$ when power is on. Accordingly, input MOS transistor TrI operates without influence when power is on.

As mentioned above, this invention provides an improved MOS transistor circuit with protective means for protecting the gate oxide of an input MOS transistor from rupture due to excessive current surges. This invention can be applied to an output MOS transistor circuit as well as an input MOS transistor circuit, as shown in FIG. 6. An output MOS transistor circuit 6 generates an output signal $V_{out}$ to the outside of an integrated circuit, through a signal output pad 600. Output MOS transistor circuit 6 may be, for example, a pushpull circuit. Output MOS transistor circuit 6 comprises, for example, a first output MOS transistor $TrO_1$ and a second output MOS transistor $TrO_2$. The first output MOS transistor $TrO_1$ is, for example, an N channel type enhancement mode transistor. The threshold voltage of transistor $TrO_1$ is, for example, 0.8 V. Transistor $TrO_1$ has a drain connected to one positive voltage level $V_{DD}$ (e.g. 5 V), a source, and the gate to receive one signal $V_{SIG}$ generated in an internal circuit (not shown).

The source of transistor $TrO_1$ is connected to the drain of second output MOS transistor $TrO_2$. The source of transistor $TrO_2$ is connected to one reference voltage level $V_{ss}$ (e.g. ground). The gate of transistor $TrO_2$ receives a signal $\overline{V_{SIG}}$ which is an inverted form of signal $V_{SIG}$. Output signal $V_{out}$ is outputted from the drain of second output MOS transistor $TrO_2$.

The drain of transistor $TrO_2$ is connected to one terminal of a protective resistor $R_p$, the other terminal of which is connected to the signal output terminal 600. Protective resistor $R_p$ functions to depress excessive current surges which occur on signal output terminal 600, and is made of, for example, a diffused semiconductor region. The value of resistor $R_p$ should not be so large as to reduce the normally required output current. The value of resistor $R_p$ is, for example, $10\Omega \sim 20\Omega$. If a larger output current is needed, resistor $R_p$ may be eliminated.

Protective circuit 10 is connected between the drain of transistor $TrO_2$ and reference voltage $V_{ss}$ (e.g. ground). Protective circuit 10 protects the gate oxides of transistors $TrO_1$ and $TrO_2$ from rupture due to excessive current surges which occur on signal output terminal 600.

Protective circuit 10 used in FIG. 6 has substantially the same arrangement and operation as that of FIG. 1, so components of protective circuit 10 in FIG. 6 are assigned the same reference numerals as corresponding components of protective circuit 10 of FIG. 1, and description thereof is omitted.

When power is off, a first terminal 11 of protective circuit 10 is effectively connected to a second terminal 12 of protective circuit 10 (i.e., the drain of output MOS transistor $TrO_2$ is connected to reference voltage level $V_{ss}$). Therefore, even if excessive current surges occur on signal output terminal 600, the surges are quickly discharged to the reference voltage level $V_{ss}$ through protective circuit 10 (i.e. through the source-drain current path of a protective MOS transistor TrP), and the gate oxides of output MOS transistors $TrO_1$ and $TrO_2$ are protected from rupture.

When power is on, terminal 11 of protective circuit 10 is disconnected from terminal 12 of protective circuit 10. Therefore the operation of output MOS transistor circuit 6 is not influenced by protective circuit 10.

As is obvious to those of ordinary skill in the art, protective circuit 10 may include changing circuit 40 as shown in FIG. 4, FIG. 5A, or FIG. 5B when used in conjunction with an output circuit as shown in FIG. 6.

Obviously, many modifications and variations of this invention are possible in the light of the above teachings. It is therefore to be understood that within the scope of the appended claims, this invention may be practiced otherwise than as specifically described.

What is claimed is:

1. A protected MOS transistor integrated circuit formed on a semiconductive substrate comprising:

an input MOS transistor having a gate to receive an input signal when power is on;

substrate voltage generating means for generating a substrate bias-voltage supplied to said substrate when power is on; and protective means including a depletion mode MOS transistor having a source-drain current path connected between a reference voltage level and said gate of the input MOS transistor, and a gate responsive to said substrate bias-voltage, said depletion mode transistor being conductive when power is off and being rendered nonconductive by said substrate bias-voltage when power is on.

2. A protected MOS transistor integrated circuit formed on a semiconductive substrate comprising:

an input MOS transistor having a gate to receive an input signal when power is on;

means for generating an oscillation signal;

substrate voltage generating means, including said oscillation signal generating means, for generating a substrate bias-voltage supplied to said substrate when power is on;

control voltage generating means, including said oscillation signal generating means, for generating a control signal different from said substrate bias-voltage; and protective means including a depletion mode MOS transistor being conductive when power is off, said depletion mode transistor having a source-drain current path connected between a reference voltage level and said gate of the input MOS transistor, and gate means for receiving said control signal to render said depletion mode transistor nonconductive when power is on.

3. A protective MOS transistor circuit comprising:

means for receiving an input signal when power is on;

an input MOS transistor having a gate connected to said receiving means;

protective means including a depletion mode MOS transistor being conductive at power off, said depletion mode transistor having a source-drain current path connected between a reference voltage level and said gate of said input MOS transistor and a gate;

means for generating a control signal when power is on, said depletion mode transistor being responsive to said control signal to render said depletion mode transistor nonconductive when power is on; and said protective means further including changing means for changing the degree of conductivity of said depletion mode MOS transistor in accordance with surges occurring at said receiving means when power is off.

4. A protected MOS transistor integrated circuit formed on a semiconductive substrate comprising:

an output MOS transistor having drain means for generating an output signal when power is on;

substrate voltage generating means for generating a substrate bias-voltage supplied to said substrate when power is on; and protective means including a depletion mode MOS transistor being conductive at power-off, said depletion mode transistor having a source-drain current path connected between a reference voltage level and said drain means of said output MOS transistor, and a gate responsive to said substrate bias-voltage to render said depletion mode transistor nonconductive when power is on.

5. A protected MOS transistor integrated circuit formed on a semiconductive substrate comprising:

an output MOS transistor having drain means for generating an output signal when power is on;

means for generating an oscillation signal;

substrate voltage generating means, including said oscillation signal generating means, for generating a substrate bias-voltage supplied to said substrate when power is on;

control voltage generating means, including said oscillation signal generating means, for generating a control signal different from said substrate bias-voltage; and protective means including a depletion mode MOS transistor being conductive when power is off, said depletion mode transistor having a source-drain current path connected between a reference voltage level and said drain means of said output MOS transistor, and gate means for receiving said control signal to render said depletion mode transistor nonconductive when power is on.

6. A protected MOS transistor circuit with protective means comprising:

an output signal terminal;

an output MOS transistor having a drain connected to said output signal terminal;

protective means including a depletion mode MOS transistor being conductive when power is off, said depletion mode transistor having a source-drain current path connected between a reference voltage level and said drain of said output MOS transistor, and a gate;

means for generating a control signal when power is on, said depletion mode transistor being responsive to said control signal to render said depletion mode transistor nonconductive when power is on; and said protective means further including changing means for changing the degree of conductivity of said depletion mode MOS transistor in accordance with surges occurring at said output signal terminal when power is off.

7. A protected MOS transistor circuit comprising:

an input MOS transistor having a gate means for receiving an input signal when power is applied to said circuit; and protective means having a control terminal, a first terminal connected to a reference voltage level and a second terminal connected to said gate means; and means, connected to said control terminal, for causing said protective means to be nonconductive between said first and second terminals when power is on and to be conductive between said first and second terminals when power is off;

said protective means further including changing means for changing the degree of conductivity of said protective means in accordance with surges occurring at said input MOS transistor gate means when power is off, said changing means including a capacitor connected between said input MOS transistor gate means and said control terminal.

8. A protected MOS transistor circuit comprising:

an output transistor having drain means for generating an output signal when power is on;

protective means having a control terminal, a first terminal connected to said drain means, a second terminal connected to a reference voltage level; and means, connected to said control terminal, for causing said protective means to be nonconductive between said first and second terminals when power is on and conductive between said first and second terminals when power is off;

said protective means including changing means for changing the degree of conductivity of said protective means in accordance with surges occurring at said drain means when power is off, said changing means including a capacitor connected between said drain means and said control terminal.

9. An MOS transistor circuit according to claim 7 or 8 wherein said changing means further comprises an enhancement mode MOS transistor having a source-drain current path connected between said gate of said depletion mode transistor and said control signal generating means, and a gate, and means for generating a second control signal when power is on, said enhancement mode transistor gate being responsive to said second control signal to render said enhancement mode MOS transistor conductive when power is on and nonconductive when power is off.

10. An MOS transistor circuit according to claim 9 wherein said changing means further comprises another enhancement mode MOS transistor having a source-drain current path connected between said gate of said depletion mode MOS transistor and said receiving means, and a gate connected to said receiving means.

11. A circuit as in claim 10 wherein:
said another enhancement mode transistor has a threshold above which said another enhancement mode transistor conducts; and
said control signal generating means generates said control signal such that the absolute value of the difference between a maximum value of said input signal and said control signal is less than the absolute value of said threshold when power is on.

12. An MOS transistor circuit according to claim 9 wherein said changing means further comprises a plurality of enhancement mode MOS transistors each having a source, a drain and a gate connected to the drain, the source-drain current paths of said plurality of enhancement mode transistors being connected in series between said gate of the depletion mode MOS transistor and said receiving means.

13. A circuit as in claim 12 wherein:
each of said plurality of enhancement mode transistors has a threshold above which each of said plurality of enhancement mode transistors conduct; and
said control signal generating means generates said control signals such that the absolute value of the difference between a maximum value of said input signal and said control signal is less than the sum of the absolute values of said thresholds of said plurality of enhancement mode transistors when power is on.

14. A protected MOS transistor circuit comprising:
an MOS transistor having a plurality of terminals;
protective means including a depletion mode MOS transistor having a source-drain current path connected between a reference voltage level and one of said plurality of terminals of said MOS transistor, a gate connected to said reference voltage level and a substrate, said depletion mode transistor having a threshold voltage that changes from negative to positive as a voltage applied to said depletion mode MOS transistor substrate becomes more negative; and
substrate voltage generating means for generating a substrate bias-voltage supplied to said substrate when power is on, said substrate bias-voltage having a sufficiently negative value to cause said depletion mode transistor threshold voltage to become positive, said depletion mode transistor being conductive when power is off and being rendered nonconductive by said substrate bias-voltage when power is on.

* * * * *